(12) United States Patent
Hung et al.

(10) Patent No.: US 10,181,425 B1
(45) Date of Patent: Jan. 15, 2019

(54) GATE-END STRUCTURE ENGINEERING FOR SEMICONDUCTOR APPLICATIONS

(71) Applicant: Taiwan Semiconductor Manufacturing Co., Ltd., Hsinchu (TW)

(72) Inventors: Chan-Yu Hung, Tainan (TW); Ling-Sung Wang, Tainan (TW); Yu-Jen Chen, Tainan (TW); I-Shan Huang, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/651,749

(22) Filed: Jul. 17, 2017

(51) Int. Cl.
| | |
|---|---|
| H01L 27/088 | (2006.01) |
| H01L 21/8234 | (2006.01) |
| H01L 27/02 | (2006.01) |
| H01L 29/423 | (2006.01) |
| H01L 29/49 | (2006.01) |
| H01L 21/3065 | (2006.01) |
| H01L 21/027 | (2006.01) |
| H01L 21/308 | (2006.01) |

(52) U.S. Cl.
CPC ......... H01L 21/823456 (2013.01); H01L 21/823431 (2013.01); H01L 27/0207 (2013.01); H01L 27/0886 (2013.01); H01L 29/42376 (2013.01); H01L 29/4958 (2013.01); H01L 29/4966 (2013.01); H01L 21/0274 (2013.01); H01L 21/3065 (2013.01); H01L 21/3081 (2013.01)

(58) Field of Classification Search
USPC ... 438/283, 157, 30, 48, 128, 149, 151, 161, 438/163; 257/57, 59, 72, 83, 257, 290, 257/351, 368, 392, 66, E21.7
See application file for complete search history.

(56) References Cited

U.S. PATENT DOCUMENTS

| | | | |
|---|---|---|---|
| 9,287,181 B2* | 3/2016 | Tseng | H01L 21/823857 |
| 9,698,101 B2* | 7/2017 | Greene | H01L 21/76895 |
| 9,755,019 B1* | 9/2017 | Fung | H01L 21/823431 |
| 2014/0070320 A1* | 3/2014 | Mukherjee | H01L 21/823456 257/368 |
| 2016/0126142 A1 | 5/2016 | Chen et al. | |
| 2016/0133632 A1* | 5/2016 | Park | H01L 21/823828 257/369 |
| 2017/0084723 A1* | 3/2017 | Greene | H01L 29/7856 |
| 2017/0221808 A1* | 8/2017 | Greene | H01L 21/76895 |

FOREIGN PATENT DOCUMENTS

| | | |
|---|---|---|
| TW | 201417291 A | 5/2014 |
| TW | 201628087 A | 8/2016 |

OTHER PUBLICATIONS

Office Action in related application TW 10720228230 dated Mar. 20, 2018.

* cited by examiner

*Primary Examiner* — Tram H Nguyen
(74) *Attorney, Agent, or Firm* — Slater Matsil, LLP

(57) ABSTRACT

Semiconductor device structures with reduced gate end width formed at gate structures and methods for manufacturing the same are provided. In one example, a semiconductor device structure includes a plurality of gate structures formed over a plurality of fin structures, the gate structures formed substantially orthogonal to the fin structures, wherein the plurality of gate structures includes a first gate structure having a first gate end width and a second gate structure having a second gate end width, wherein the second gate end width is shorter than the first gate end width.

19 Claims, 9 Drawing Sheets

GATE-END STRUCTURE ENGINEERING FOR SEMICONDUCTOR APPLICATIONS

BACKGROUND

Reliably producing sub-half micron and smaller features is one of the key technology challenges for next generation very large scale integration (VLSI) and ultra large-scale integration (ULSI) of semiconductor devices. However, as the limits of circuit technology are pushed, the shrinking dimensions of VLSI and ULSI technology have placed additional demands on processing capabilities. Reliable formation of gate structures on the substrate is important to VLSI and ULSI success and to the continued effort to increase circuit density and quality of individual substrates and die.

As the semiconductor industry has progressed into nanometer technology process nodes in pursuit of higher device density, higher performance, and lower costs, challenges from both fabrication and design have resulted in the development of three dimensional designs, such as fin-like field effect transistors (FinFETs). A typical FinFET is fabricated with a fin structure extending from a substrate, for example, by etching into a silicon layer of the substrate. The channel of the FinFET is formed in the vertical fin. A gate structure is provided over (e.g., overlying to wrap) the fin structure. It is beneficial to have a gate structure on both sides of the channel allowing gate control of the channel from both sides. FinFET devices provide numerous advantages, including reduced short channel effects and increased current flow.

As the device dimensions continue scaling down, existing device structures may not be satisfactory in all aspects. Photolithography limitations often constrain the process capability to provide gate structures with smaller dimensions. Thus, FinFET device structures with desired adjustable or decreased gate dimensions are considered and desired to provide the device structures with desired electrical performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
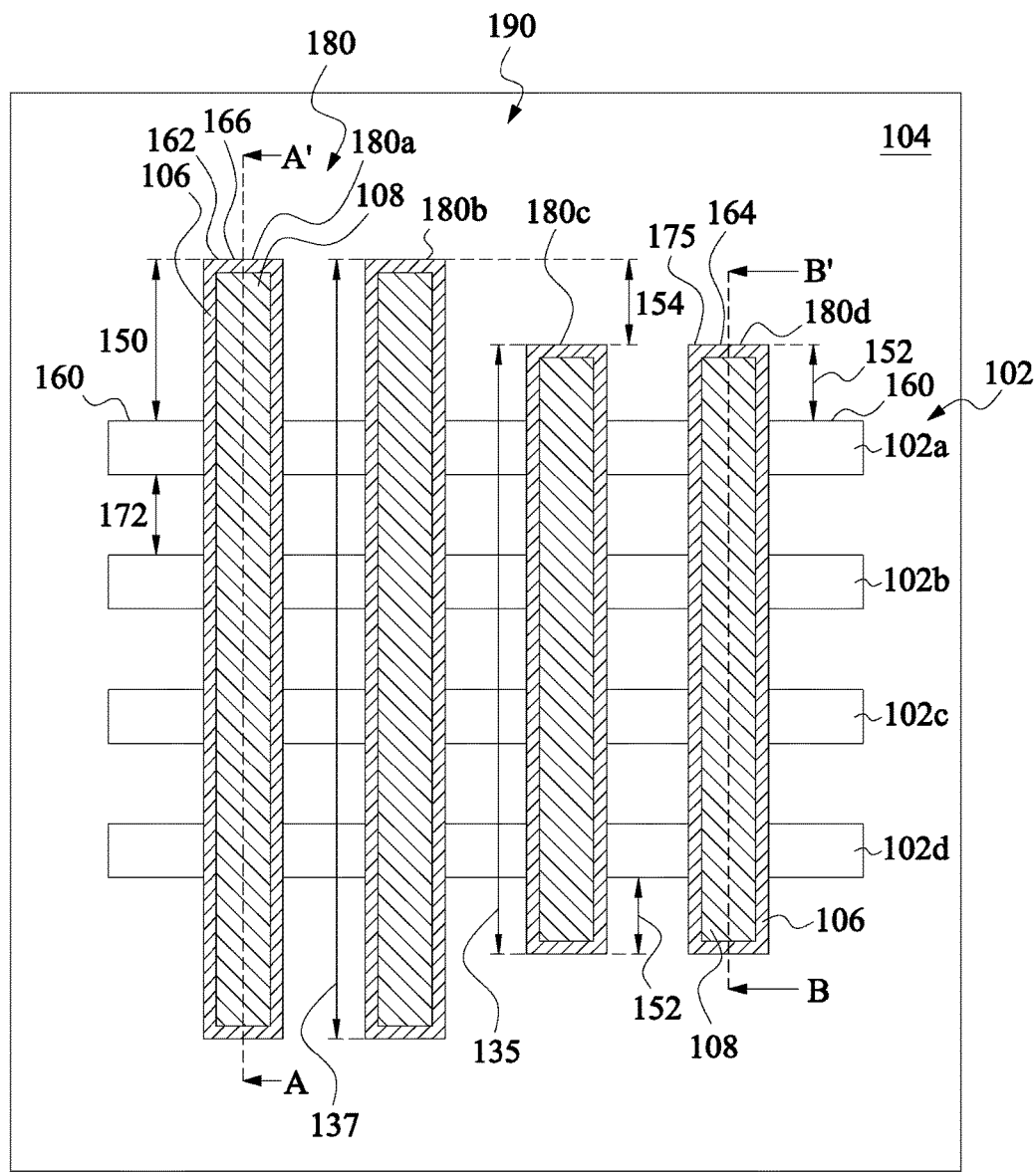
FIG. 1 is a top view of a first semiconductor device structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a top view of an example of a semiconductor device structure 190 in accordance with some embodiments. The semiconductor device structure 190 is configured to have a relatively decreased effective gate width but with an enhanced work function of a gate structure of a fin field effect transistor (FinFET). The semiconductor device structure 190 includes a plurality of gate structures 180 (shown as 180a, 180b, 180c and 180d) formed over a plurality of fin structures 102 (shown as 102a, 102b, 102c, 102d). The plurality of gate structures 180 is formed substantially orthogonal to the fin structures 102. It is noted that although four gate structures 180a, 180b, 180c, 180d and four fin structures 102a, 102b, 102c, 102d are shown in FIG. 1, the gate structures and the fin structures may be in any numbers as needed.

Figure 7A:
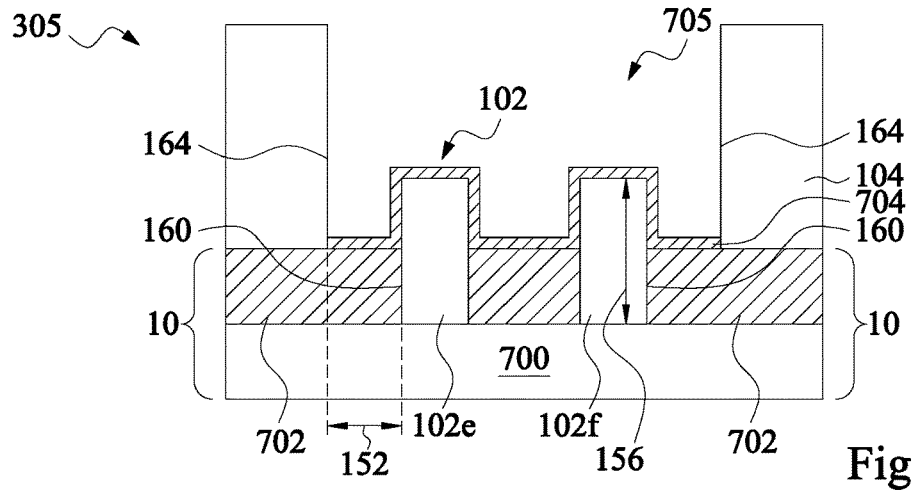
FIGS. 7A-7C depict cross sectional views of a substrate with composite structures at different stages of the manufacturing process depicted in FIG. 6 in accordance with some embodiments.
Figure 7B:
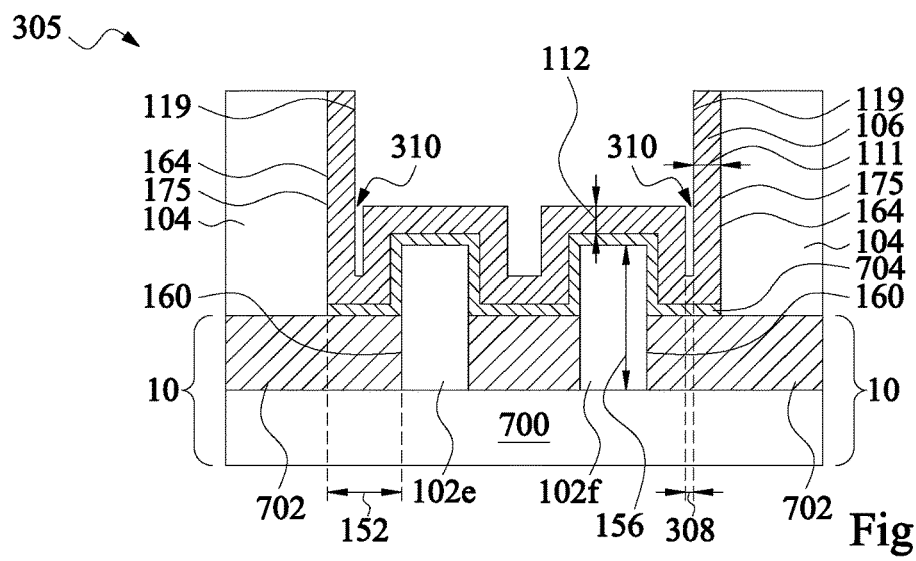
Figure 7C:
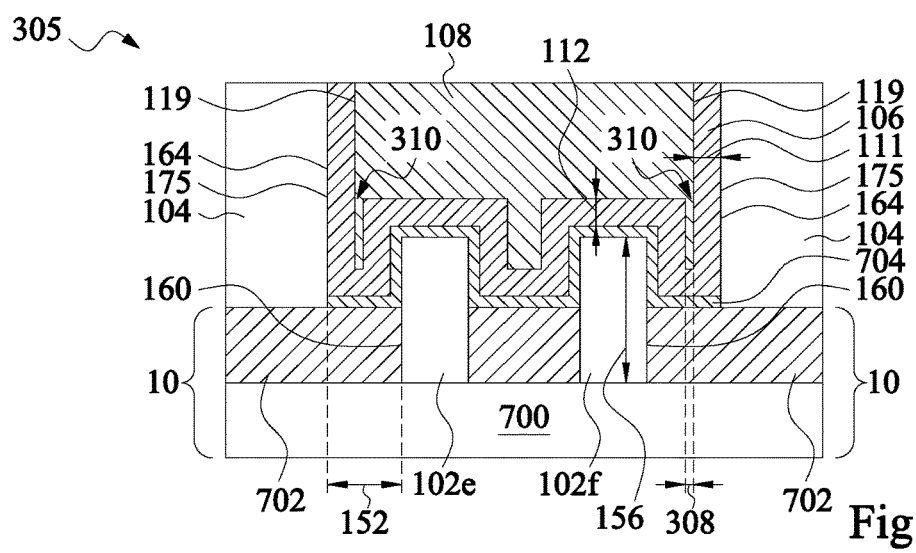

The gate structure 180 includes a work function metal layer 106 formed on a gate dielectric layer (shown in FIGS. 7A-7C). A metal fill layer 108 is filled and formed on the work function metal layer 106. It is noted that in some cases, the metal fill layer 108 may also be called as contact metal layer. However, numerous other layers may be included in the gate structure 180. The gate structure 180 may include a metal gate electrode or also referred as a metal gate structure. An interlayer dielectric (ILD) layer 104 is formed having an opening that allows the gate structures 180 and the fin structures 102 to be formed therein.

In the example depicted in FIG. 1, a first group of the gate structures 180c, 180d has a gate width 135 less than a gate width 137 of a second group of the gate structures 180a, 180b. In this example, the first and the second groups of the gate structures have mismatched gate end widths, such as different gate end widths. In particular, the first group of the gate structures 180c, 180d has a relatively decreased gate end width 152, as compared to a regular gate end width 150 in the second group of gate structures 180a, 180b. It is noted that the gate end width as described here is referred as the portion of the longitudinal width 135, 137 along the body of the gate structure 180 starting from a sidewall 160 (e.g., facing an end vertical sidewall, 162 164 of the ILD layer 104) of the outermost fin structure 102a or 102d among an array of the fin structures 102 to an end 175, 166 of the gate structure 180. The end 175, 166 of the gate structure 180 is interfaced and in contact with the vertical sidewalls 164, 162 of the ILD layer 104. The end vertical sidewall 162, 164 of the ILD layer 104 mates with the end 175, 166 of the gate structures 180, creating a shared interface therebewteen. Alternatively, the gate end width may also be referred as a closest distance from the sidewall 160 of the outermost fin structure 102a or 102d to the end 175, 162 of the gate structures 180. It is noted that as the end 175, 162 of the gate structures 180 mates with the vertical sidewall 162 164 of the ILD layer 104, the gate end width may also be referred as the distance from the sidewall 160 of the outermost fin structure 102a or 102d to the vertical sidewall 162 164 of the ILD layer 104, which has a shared interface with the end 175, 162 of the gate structures 180.

It is believed that a shorter gate end width (or called a gate end cap) of a fin field effect transistor (FinFET) increases the thickness of a work function metal formed therein so as to enhance the device electrical performance. Thus, by providing the decreased gate end width 152 of the gate structures 180c, 180d of the semiconductor device structure 190, the thickness (or density) of the work function metal formed in gate end width region of the FinFETs is enhanced or doubled so as to provide the semiconductor device structure 190 with enhanced electrical performance and properties.

The first group of the gate structures 180a, 180b with the first (e.g., regular) gate end width 150 may be formed and positioned on one side in parallel to the second group of the gate structures 180c, 180d of the second (e.g., reduced) gate end width 152. Although the gate structures 180 of FIG. 1 are divided into two groups with the first group having the regular gate end width 150 of gate structures 180a, 180b and the second group having the reduced gate end width 152 of gate structures 180c, 180d, it is noted that the numbers of the gate structures with reduced or regular gate end width 152, 150 may be in any number as needed for device performance requirements. More examples of configurations and arrangements of the gate structures 180 will be further discussed below with reference to FIGS. 5A-5B.

In one example, the mismatched gate end widths formed in the gate structures 180 may be achieved and obtained by utilizing a photomask reticle having patterns with the desired mismatched gate end widths. For example, an IC designer may use software algorithm to design the semiconductor device structure 190 with a design layout having the desired patterns (e.g., in this example, the mismatched gate end widths of gate structures). The design layout is then output and transmitted to a controller connected to a lithographic tool. The lithographic tool may then process the design layout and imprint such design layout on a photoresist layer disposed on a photomask reticle. Subsequently, a conventional etching process may be performed to print and transfer the design layout into the photomask reticle. Thus, when manufacturing the semiconductor device structure 190 with the mismatched gate end widths of the gate structures, several photolithography and etch processes may be performed utilizing the photomask reticle with the selected design layout to transfer the patterns of mismatched gate end widths from the photomask reticle to the substrate on which the semiconductor device structures 190 are formed.

In one example, the photolithography process includes forming a photoresist resist overlying the substrate, exposing the resist to patterns of the selected design layout from the photomask reticle, performing post-exposure bake processes, and developing the resist to form a masking element including the resist. The masking element including the patterns of the selected design layout (e.g., the mismatched gate end widths of the gate structures) may then be used to protect certain regions of the substrate while an etch process forms recesses into the substrate, resulting in the desired patterns, such as the mismatched gate end widths 150, 152 of the gate structures 180, as shown in FIG. 1. Numerous other examples of the photolithography and etch processes for forming mismatched gate end widths of the gate structures on a substrate may be utilized. It is noted that the photomask reticle (or more than one photomask reticles) with the patterns of mismatched gate end widths of the gate structures may be used multiple times at different manufacturing stages throughout the semiconductor device structure manufacturing process to form the semiconductor device structures 190 with the desired patterns of the mismatched gate end widths of the gate structures. While only two different gate end widths are discussed herein, it is contemplated that three, four, five or more gate end widths may be utilized.

In one example, the photomask reticle may be utilized to form and pattern the ILD layer 104 with different dimensions of the openings defined along the end vertical sidewall 164 of the ILD layer 104 so as to allow the gate structures 180 with different gate end widths 152, 150 to be formed therein.

Figure 2A:
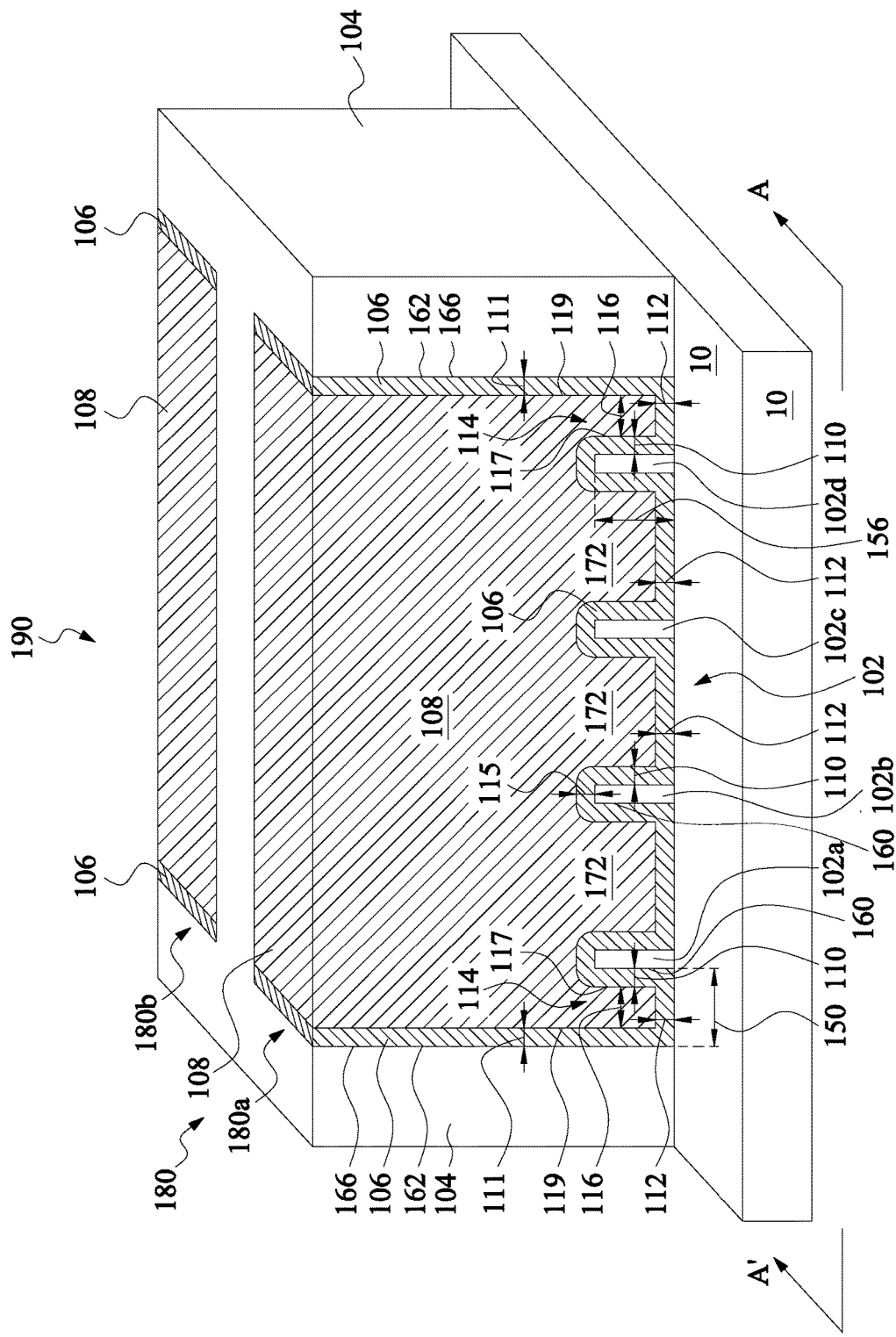
FIG. 2A-2B are perspective views of different locations of the first semiconductor device structure of FIG. 1 in accordance with some embodiments.

FIG. 2A depicts a perspective view of the semiconductor device structure 190 cutting along the line A-A' of the gate structure 180a of FIG. 1. The gate end width 150 is defined between the sidewall 160 of the outermost fin structure 102a and the vertical sidewall 162 defined by the ILD layer 104. The semiconductor device structure 190 is formed on a substrate 10 that includes other structures formed therein, such as shallow trench isolation (STI) structures with diffusion regions (e.g., active regions) formed therein and/or a fin structure formed around shallow trench isolation structure (e.g., a FINFET structure), or any other suitable structures utilized in a semiconductor substrate. One example of the substrate 10 that includes other structures formed therein will be further illustrated below with reference to FIG. 7A-7C.

In one example, the substrate 10 include materials selected from at least one of crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass and sapphire. In the embodiment wherein a SOI structure is utilized for the substrate 10, the substrate 10 may include a buried dielectric layer disposed on a silicon crystalline substrate. In the embodiments depicted herein, the substrate 10 is a silicon containing material, such as crystalline silicon substrate. Moreover, the substrate 10 is not limited to any particular size, shape or materials. The substrate 10 may be a round/circular substrate having a 200 mm diameter, a 300 mm diameter or other diameters, such as 450 mm, among others. The substrate 10 may also be any polygonal, square, rectangular, curved or otherwise non-circular workpiece, such as a polygonal glass substrate as needed.

In one example, the semiconductor device structure 190 includes an n-type FinFET or a p-type FinFET. The semiconductor device 190 may be included in an IC such as a microprocessor, memory device, and/or other IC. The semiconductor device structure 190 includes the plurality of fin structures 102 and the gate structure 180 disposed on each of the fin structures 102. Each of the plurality of fin structures 102 include a source/drain region (not shown) where a source or drain feature is formed in, on, and/or surrounding the fin structures 102.

The fin structures 102 provide an active region where one or more devices are formed. The fin structures 102 are fabricated using suitable processes including photolithography and etch processes. The photolithography process includes forming a photoresist layer (resist) overlying the substrate, exposing the resist to a pattern, performing post-exposure bake processes, and developing the resist to form a masking element including the resist. The masking element may then be used to protect regions of the substrate while an etch process forms a recesses into the substrate, leaving an extending fin, such as the fin structures 102, as shown in FIG. 2A. The recesses may be etched using reactive ion etch (RIE) and/or other suitable processes. Numerous other embodiments of methods to form a fin structure on a substrate may be utilized.

In one embodiment, the fin structures 102 are approximately 10 nanometer (nm) wide and between approximately 10 nm and 60 nm in height 156, such as about 50 nm high. However, it should be understood that other dimensions may be used for the fin structures 102. In one example, the fin structures 102 comprise silicon materials or another elementary semiconductor, such as germanium, a compound semiconductor including silicon carbide, gallium arsenic, gallium phosphide, indium phosphide, indium arsenide, and/or indium antimonide. The fin structures 102 may also be an alloy semiconductor including SiGe, GaAsP, AlInAs, AlGaAs, GaInAs, GaInP, and/or GaInAsP, or combinations thereof. Further, the fin structures 102 may be other doped using n-type and/or p-type dopants as needed. The fin structures 102, and/or the layers used to pattern the fins or adjacent STI regions, may have been subjected to one or more trimming processes.

As discussed above, the gate structure 180 includes the metal fill layer 108 and the work function metal layer 106 formed on an optional gate dielectric layer (shown as 704 in FIGS. 7A-7C). Additional layers, such as interface layer, liner layer, barrier layer, or other suitable layers, may also be formed in the gate structure 180 as needed. The gate dielectric layer or other layers, if any, is not shown in FIGS. 2A-2B for sake of clarity. The gate dielectric layer of the gate structure 180 may include silicon dioxide. The silicon oxide may be formed by suitable oxidation and/or deposition methods. Alternatively, the gate dielectric layer of the gate structure 180 may include a high-k dielectric layer such as hafnium oxide (HfO$_2$). Alternatively, the high-k dielectric layer may optionally include other high-k dielectrics, such as TiO$_2$, HfZrO, Ta$_2$O$_3$, HfSiO$_4$, ZrO$_2$, ZrSiO$_2$, combinations thereof, or other suitable material. The high-k dielectric layer may be formed by atomic layer deposition (ALD) and/or other suitable methods.

The work function metal layer 106 is formed for tuning the work function of the later formed metal gates in an NMOS or a PMOS. Thus, work function metal layer 106 may be p-type work function metal materials for PMOS devices or n-type work function metal materials for NMOS devices. Suitable examples of the p-type work function metals, which may have a work function ranging between 4.8 eV and 5.2 eV, include TiN, TaN, Ru, Mo, Al, WN, ZrSi$_2$, MoSi$_2$, TaSi$_2$, NiSi$_2$, WN, other suitable p-type work function metal materials, and combinations thereof. Suitable examples of the n-type work function metal materials, which may have a work function ranging between 3.9 eV and 4.3 eV, include Ti, Ag, TaAl, TaAlC, HfAl, TiAl, TiAlN, TaC, TaCN, TaSiN, Mn, Zr, other suitable n-type work function metal materials, or combinations thereof.

A work function value is associated with the material composition of the work function metal layer 106. The material of the work function metal layer 106 is chosen to tune its work function value so that a desired threshold voltage (Vt) is achieved in the device that is to be formed in the respective region. The work function metal layer 106 provides uniform threshold voltage (Vt) and drain voltage. The work function metal layer 106 may be deposited by CVD, PVD, ALD and/or other suitable process. In one example depicted herein, the work function metal layer 106 is formed using an ALD process.

The metal fill layer 108 is formed over the work function metal layer 106 within openings defined in the ILD layer 104. The metal fill layer 108 may be a contact metal layer formed by CVD, PVD, plating, and/or other suitable processes. The metal fill layer 108 may include Al, W, or Cu and/or other suitable materials. The metal fill layer 108 may be formed by CVD, PVD, plating, and/or other suitable processes. The metal fill layer 108 may be deposited over the work function metal layer 106, thus filling in the remaining portion of the openings defined by the ILD layer 104.

The ILD layer 104 may be a dielectric layer formed by chemical vapor deposition (CVD), high density plasma CVD (HDP-CVD), spin-on deposition, physical vapor deposition (PVD or sputtering), or other suitable methods. The dielectric layer may be formed from materials such as silicon containing material, a low-k material, and/or other suitable dielectric materials. Suitable examples of the dielectric materials for the ILD layer 104 include silicon oxide, silicon oxynitride, tetraethylorthosilicate (TEOS) oxide, un-doped silicon glass, or doped silicon oxide such as boro-phosphosilicate glass (BPSG), fused silica glass (FSG), phosphosilicate glass (PSG), boron doped silicon glass (BSG), and/or other suitable dielectric materials.

Figure 2B:
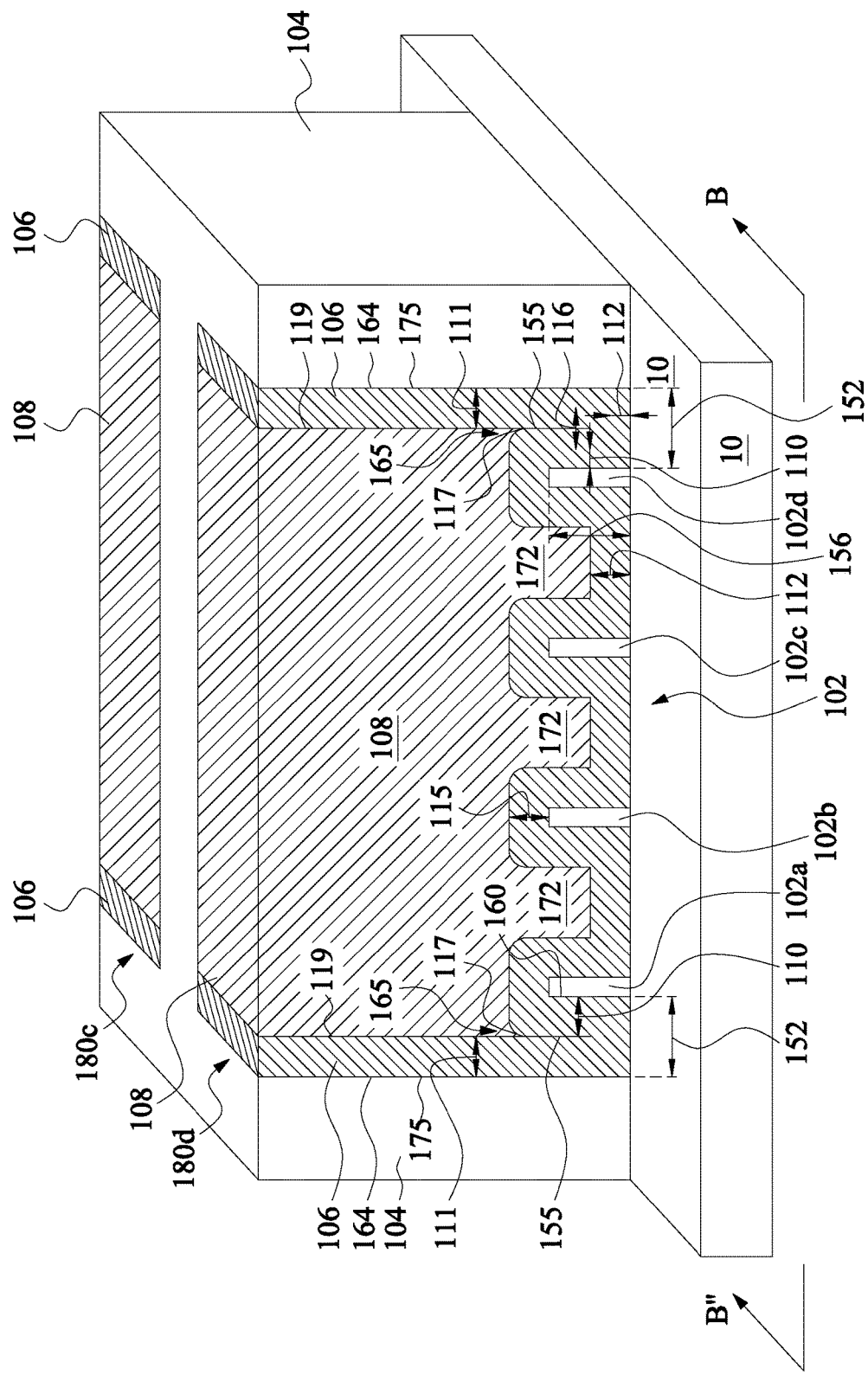

In one example described here, the ILD layer 104 is deposited by a PECVD process, a HDP-CVD process or other suitable deposition technique. After its formation, a chemical mechanical polishing (CMP) process is performed to planarize the ILD layer 104. A dummy gate structure, when used, may serve as a planarization stop for the CMP process. In other words, the CMP process may be stopped exposure of a top surface of the dummy gate structure so as to form the ILD layer 104 surrounding the dummy gate structure. It is noted that the gate structure 180 is formed in the opening of the ILD layer 104 after a dummy gate is removed therefrom. The dummy gate structure is previously formed on the substrate 10 covering the fin structures 102, and the ILD layer 104 may be formed in an opening region defined by the dummy gate structure. After the opening region is filled with the ILD layer 104, then the dummy gate structure is removed to define the opening in the ILD layer 104 and expose the fin structures 102. The opening in the ILD layer 104 then allows the gate structure 180 (e.g., including the work function layer 106 and the metal fill layer 108) to be formed therein. The ILD layer 104 illustrated in FIGS. 2A-2B is after one or more CMP processes and dummy gate removal followed by a gate structure formation process to form the work function layer 106 and the metal fill layer 108.

As shown in FIG. 2A, the work function metal layer 106 is a conformal layer formed on the substrate 10 and covers the fin structures 102. The work function metal layer 106 is formed using an ALD process that allows the work function metal layer 106 to be formed conformally and uniformly across the outer contour of the fin structures 102, resulting in a substantially similar thickness across the substrate 10. For example, the work function metal layer 106 may have a bottom thickness 112 (Y) on the substrate 10 similar to a lateral thickness 110 (Y) on the sidewall 160 of the fin structures 102. Also, the bottom thickness 112 and the lateral thickness 110 of the work function metal layer 106 are similar to a side thickness 111 (Y) on the sidewall 162 of the ILD layer 104 and a top thickness 115 (Y) on a top surface of the fin structures 102. In one example, the bottom thickness 112 (Y), the lateral thickness 110 (Y), the top thickness 115 (Y) and the side thickness 111 (Y) are between about 5 nm and about 30 nm, such as between about 10 nm and about 20 nm.

The thickness of the work function metal layer 106 may be adjusted or controlled by altering the process parameters, such as deposition time, deposition temperature, process parameters as well as numbers of the precursor pulses during the ALD process. For example, a longer deposition process time provides the work function metal layer 106 with greater thickness and vice versa. Alternatively, the thickness of the work function metal layer 106 is also often controlled or adjusted by altering numbers and the frequency of precursors pulse supplied during the ALD process. Furthermore, higher RF source or bias powers, when used, during the ALD process may also provide the work function metal layer 106 with greater thickness. Higher substrate temperature range may also increase deposition rate of the work function metal layer 106 during the ALD process, thus increasing the resultant thickness of the work function metal layer 106. In one example depicted herein, the thickness of the work function metal layer 106 is adjusted by altering the process deposition time. In some examples, the bottom thickness 112 may be slightly greater than the side thickness 111 and the lateral thickness 110 due to gravity and/or bias power perpendicular directionality, if any, during deposition.

The thickness (Y) of the work function layer 106 is controlled in a manner sufficient to conformally cover the fin structures 102 and line against the sidewall 162 of the ILD layer 104 without overgrowth, which may result in merging at regions 172 between the fin structures 102. The work function layer 106 merged at the regions 172 between fin structures 102 may adversely result in short circuit or current leakage.

In the example depicted in FIG. 2A with the regular gate end width 150, a gap 114 is defined between a side surface 117 of the work function layer 106 formed on the fin structure 102a, 102d and an inner wall 119 of the work function layer 106 leaning against the ILD layer 104. In one example, the gap 114 has a gap width 116 (Z). The gate end width 150 (X) includes the gap width 116 and the thickness of the work function metal layer 106 at both ends. For example, the gate end width 150 is a combination of the thickness from the side thickness 111 (Y) of the work function metal layer 106, the gap width 116 (Z) and the lateral thickness 110 (Y) of the work function metal layer 106; e.g., $X=2Y+Z$, when the side thickness 111 (Y) and the lateral thickness 110 (Y) of the work function metal layer 106 are identical. Thus, by controlling the gate end width 150 as well as the thickness of the work function layer 106, the gap width 116 defined in the gap 114 may be controlled without overgrowth in the regions 172 between fin structures 102. In the example depicted in FIG. 2A, the gate end width 150 is sufficiently long to allow the work function metal layer 106 to be conformally formed on the vertical sidewall 162 of the ILD layer 104 and on the substrate 10 and covering over the fin structures 102, without merging both in the gap 114 and in the region 172.

In one example, the gate end width 150 (X) of the gate structure 180a depicted in FIG. 2A is greater than two times the thickness of the work function layer 106 (e.g., $X>2Y$), since the gate end width 150 (X) include the thicknesses (Y+Y) of the side thickness 111 and the lateral thickness 110 of the work function metal layer 106 and the gap width 116 (Z).

FIG. 2B depicts a perspective view of the semiconductor device structure 190 cutting along the line B-B' of the gate structure 180d of FIG. 1. In this example, the gate end width 152 (X') is defined between the sidewall 160 (e.g., facing the vertical sidewall 164 of the ILD layer 104) of the outermost fin structure 102a and the vertical sidewall 164 defined by the ILD layer 104. The gate end width 152 is configured to be shorter than the gate end width 150. An exemplary width difference 154 is shown in FIG. 1. In one example, the gate end width 152 of the gate structure 180d is about 20% to 60%, such as 30% to about 50%, shorter than the gate end width 150 of the gate structure 180a (e.g., $X'<X$). In one specific example, the gate end width 152 of the gate structure 180d is about 35% to 40% shorter than the gate end width 150 of the gate structure 180a. In one example, the gate end width 152 of the gate structure 180d is between about 20 nm and about 50 nm and the gate end width 150 of the gate structure 180a is between about 25 nm and about 75 nm.

As the gate end width 152 of gate structure 180d is reduced, the work function metal layer 106 formed over the fin structure 102 might not be conformally formed at the region defined by the gate end width 152 due to the reduced space. Thus, the side surface 117 of the work function layer 106 may be formed in close proximity to the inner wall 119 of the work function layer 106 leaning against the ILD layer 104, thus leaving a gap 165 smaller than the gap 114 of FIG. 2A and a gap width 155 (Z') smaller than the gap width 116 of FIG. 2A. In some examples, when the side surface 117 merges or directly contacts the inner wall 119, the gap width 155 (Z') in the small gap 165 may approach zero, thus becoming negligible, such as less than 5 nm, for example less than 3 nm.

In the example depicted in FIG. 2B, the gap width 155 in the small gap 165 is negligible, thus forming the merged structure, such as the merged work function metal layer 106 at one end of the gate structure 180. In such an example, the reduced gate end width 152 is approximately a combination of the side thickness 111 and the lateral thickness 110 of the work function metal layer 106 without any gap width from the small gap 165. Thus, the reduced gate end width 152 (X') is about two time the thickness of the work function layer 106, e.g., $X'=2Y$, as represented by the side thickness 111 and the lateral thickness 110.

As discussed above, as the thickness of the lateral thickness 110 (Y) and the side thickness 111 (Y) are between about 5 nm and about 30 nm, such as between about 10 nm and about 20 nm, the thickness of the reduced gate end width 152 (X'=2Y) is about 10 nm and about 60 nm, such as about 20 nm and about 40 nm.

In some examples wherein the side thickness 111 and the lateral thickness 110 of the work function metal layer 106 are overly merged or even overlap, the reduced gate end width 152 (X') may be less than two times the thickness of the work function layer 106, but greater than either the side thickness 111 or the lateral thickness 110 of the work function metal layer 106, e.g., Y<X'<2Y. In such example, the reduced gate end width 152 (X') may have a thickness about 10 nm and about 50 nm, such as about 20 nm and about 35 nm.

It is believed that the merged structure of the work function metal layer 106 at the gate end provides a better device performance with higher current at similar threshold voltage (Vt). However, an overly thick work function metal layer 106 (such as greater than 60 nm) may also adversely result in merger of the work function metal layer 106 in the regions 172 between the fin structures 102. Thus, a well-controlled range of the thickness of the work function metal layer 106 that may selectively merges the work function metal layer 106 at the gate end (e.g., the region defined by the gate end width 150, 152 leaning against the vertical sidewall 162, 164 of the ILD layer 104) may boost the device electrical performance, but avoids overgrowth or merger at the regions 172, which may prevent short circuit or current leakage.

As discussed above, shorter effective gate length and/or width of the device structure increases the speed of the transistor devices. Thus, by utilizing a reduced gate end width 152 of gate structure 180d, as well as the merged (or thicker) work function metal layer 106 at the gate end, a device structure with enhanced electrical performance of higher current, higher electron mobility, high speed and low leakage current at the same may be obtained. Also, by controlling the dimension of the gate end width 152 as well as the thickness of the work function metal layer 106, the device performance as well as other parameters of the FinFET may be tuned or altered.

In one example, when higher device operating speed is required for certain device structures, such as logic circuit devices for CPU, graphic cards or mobile devices and the like, higher numbers of gate structures having the reduced gate end widths relative to the gate structures having the regular gate end widths may be utilized. For example, the numbers of the gate structures having the reduced gate end widths in the semiconductor device structure may be greater than the numbers of the gate structures having the regular gate end widths. In one example, the numbers of the gate structures having the reduced gate end widths in the semiconductor device structure may be 15 percent to 70 percent greater than the numbers of the gate structures having the regular gate end widths.

In contrast, for certain device structures with requirement of the device operating speed not as high as logic circuit devices, such as memory or storage devices and the like, lower numbers of gate structures having the reduced gate end widths relative to the gate structures having the regular gate end widths may be utilized. For example, the numbers of the gate structures having the reduced gate end widths in the semiconductor device structure may be less than the numbers of the gate structures having the regular gate end widths. In one example, the numbers of the gate structures having the reduced gate end widths in the semiconductor device structure may be 15 percent to 70 percent less than the numbers of the gate structures having the regular gate end widths.

It is noted that the reduction of the gate end width 152 of the gate structure 180d would not affect the pitch and/or distance (e.g., in the regions 172) between the fin structures 102. Thus, the merger of the work function metal 106 at the gate end (e.g., by dimension reduction of the gate end width 152) would not affect the electrical performance between the fin structures 102.

Figure 3:
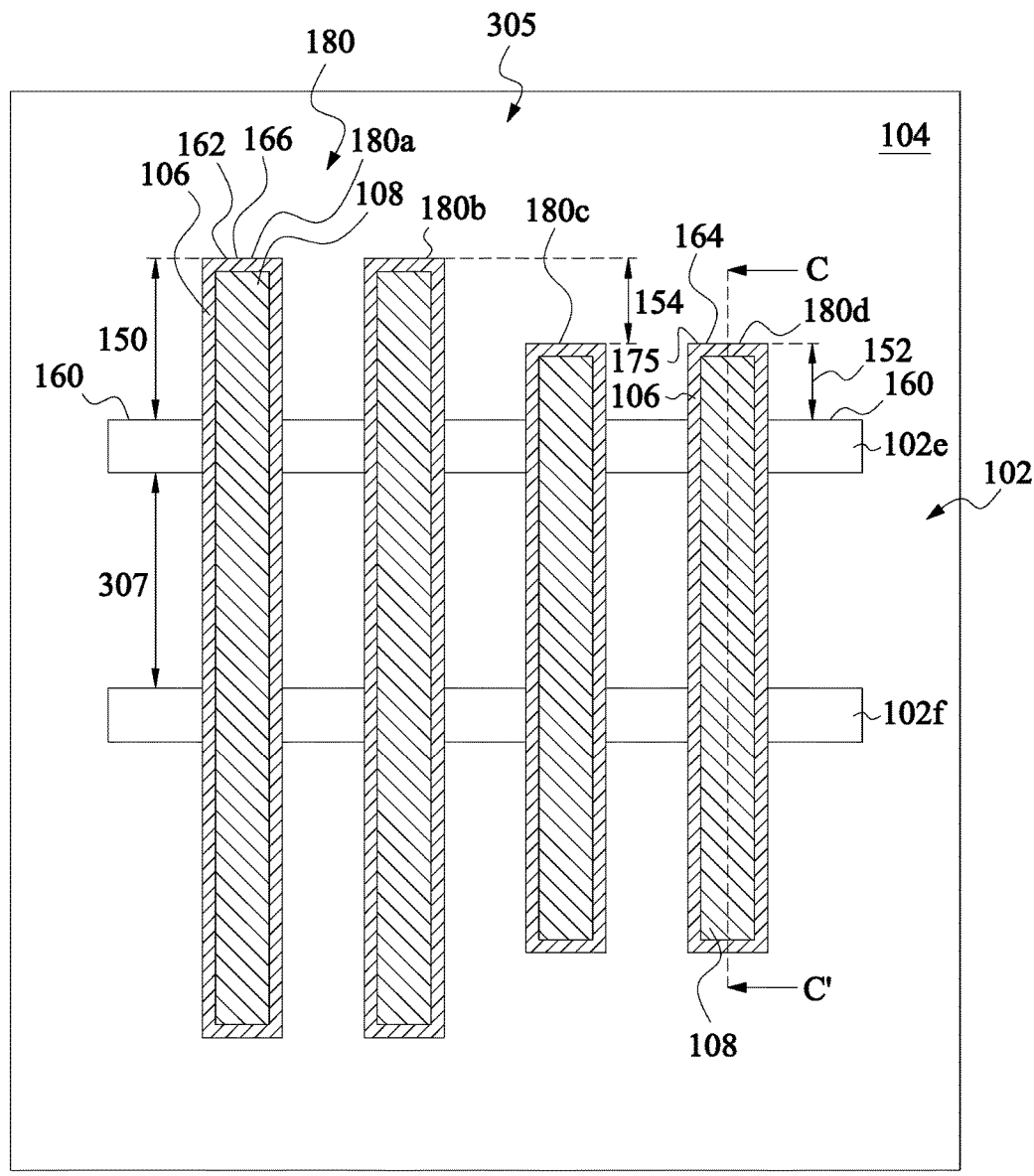
FIG. 3 is a top view of a second semiconductor device structure in accordance with some embodiments.

FIG. 3 is a top view of another example of a semiconductor device structure 305 in accordance with some embodiments. The semiconductor device structure 305 as shown in FIG. 3 has similar reduced gate end width formed at the gate end structures as described in FIGS. 1 and 2B except fewer number of the fin structures 102. Instead of the four fin structures 102 (shown as 102a, 102b, 102c, 102d) shown in FIG. 1-2B, the semiconductor device structure 305 has two fin structures 102 (shown as 102e, 102f). It is noted that the numbers of the fin structures 102 may be varied or in any arrangement as needed.

In the example depicted in FIG. 3, the reduced gate end width 152 is formed on the gate structure 108d so as to provide a shorter effective gate width for electrical performance enhancement. As the number of the fin structures 102 in the semiconductor device structure 305 is two, compared to the four fin structures 102 of FIG. 1, a region 307 between the fin structures 102e, 102f may have different dimension than region 172 of FIGS. 1-2A.

Figure 4:
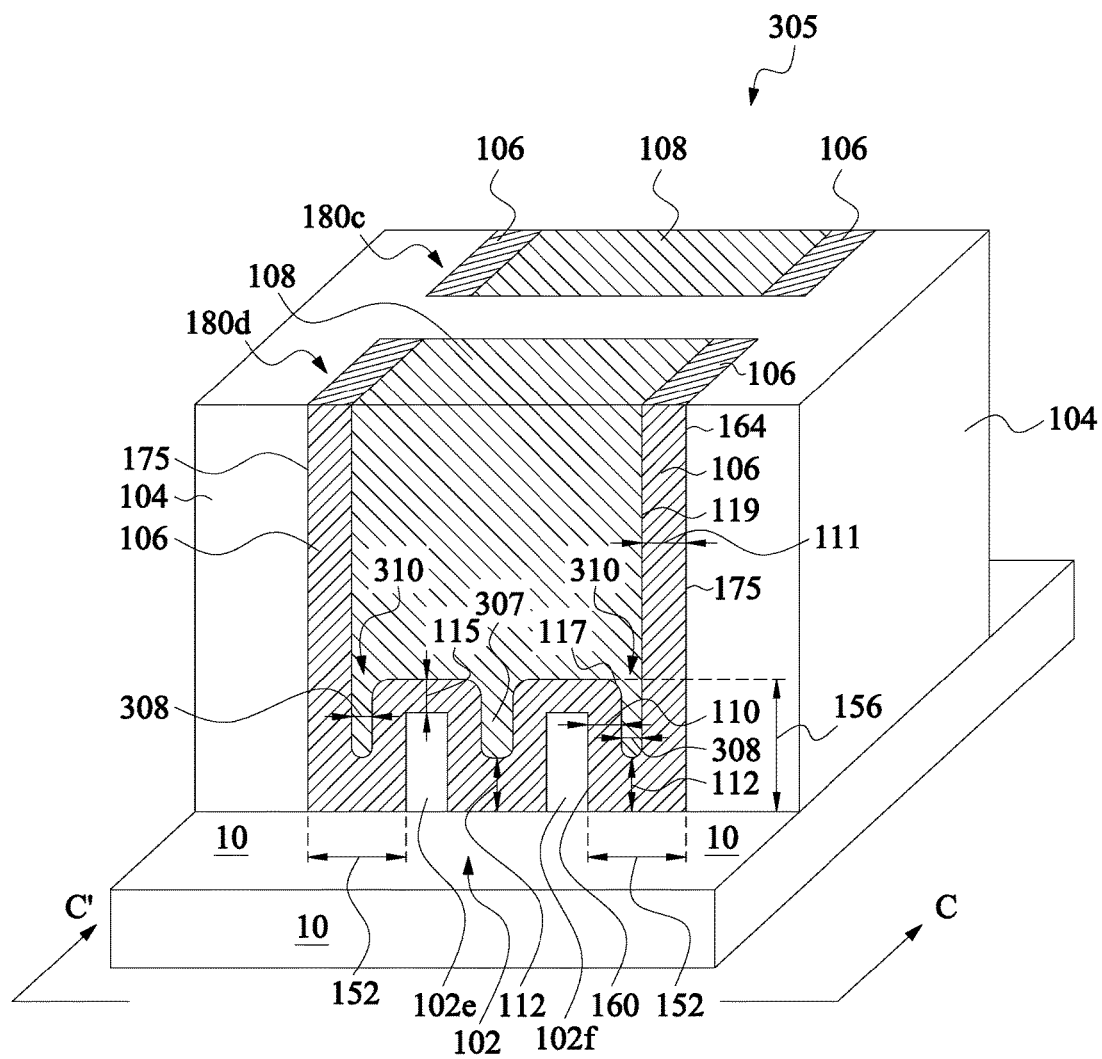
FIG. 4 is a perspective view of a certain location of the second semiconductor device structure of FIG. 3 in accordance with some embodiments.

FIG. 4 depicts a perspective view of the semiconductor device structure 305 cutting along the line C-C' of the gate structure 180d of FIG. 3. The gate end width 152 is defined between the sidewall 160 of the fin structure 102f to the vertical sidewall 164 defined by the ILD layer 104. As the number of fin structures 102 formed in the semiconductor device structure 305 is reduced, the pitch or distance between the fin structures 102, such as between the fin structures 102e, 102f, may be reduced, increased or equal to the pitch or distance of the region 172 depicted in FIGS. 1-2B.

Similarly, the work function metal layer 106 is conformally formed in the opening defined in the ILD layer 104 covering the fin structures 102e, 102f. By controlling the gate end width 152 and the thickness of the work function metal layer 106, a gap 310 formed between the side surface 117 of the work function layer 106 and the inner wall 119 of the work function layer 106 leaning against the ILD layer 104 having a gap width 308 may be tuned and adjusted. Similarly, the gap width 308 may be controlled in a manner that may allow the work function metal layer 106 to be merged, similar to the example in FIG. 2B, while leaving a desired distance in the region 307 between the fin structures 102e, 102f. Although the example depicted in FIG. 4 shows the gap width 308 at a relatively small range, it is noted that the gap width 308 may range from 0 nm (e.g., merged work function metal layer 106) to 20 nm as needed.

Figure 5A:
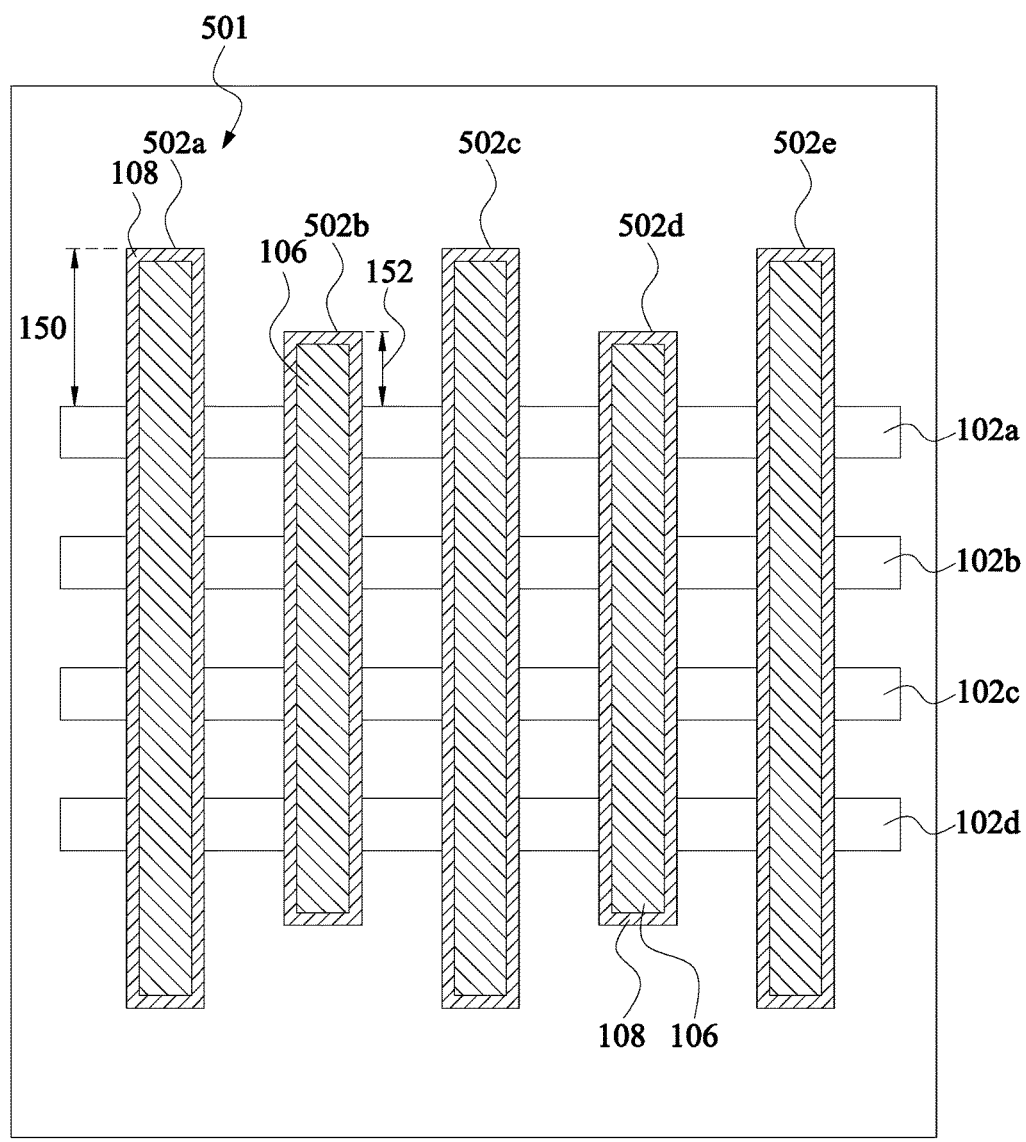
FIGS. 5A-5B are top views of other semiconductor device structures in accordance with some embodiments.
Figure 5B:
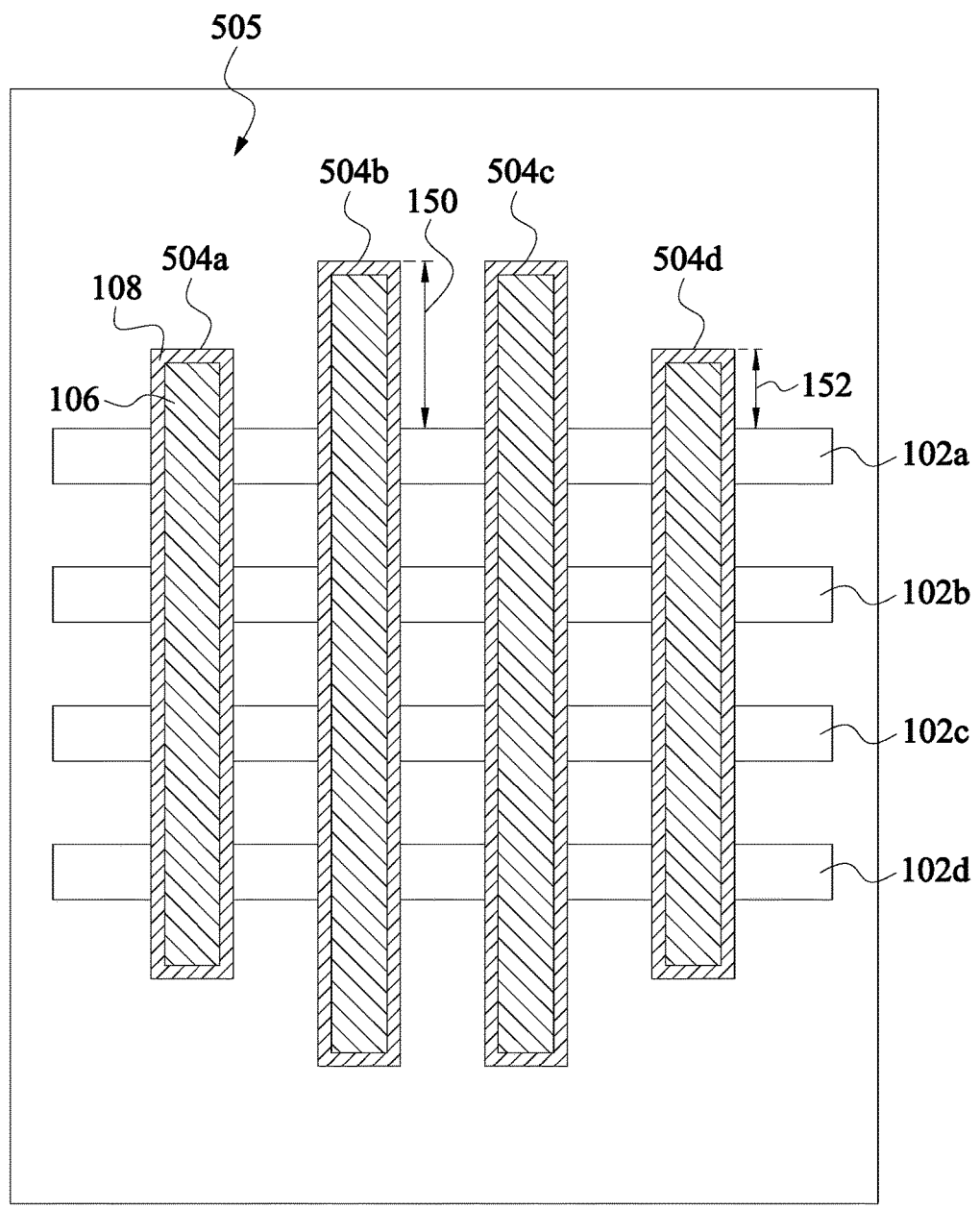

FIGS. 5A and 5B depict top views of other examples of semiconductor device structures 501, 505. Each semiconductor structure 501, 505 has different numbers of gate structures with different arrangements of the reduced gate widths. In the semiconductor device structure 501 depicted in FIG. 5A, the gate structures 502b, 502d have reduced gate end width 152, and the gate structures 502a, 502c, 502e have regular gate end 150. Each of the gate structures 502b, 502d and the gate structures 502, 502c may intervene with each other or vice versa, and the number of the gate structures with different gate end widths may vary as needed.

In the semiconductor device structure 505 depicted in FIG. 5B, a first group of gate structures 504b, 504c with the regular gate end width 150 may be circumscribed or sandwiched between a second group of gate structures 504c, 504d with the reduced gate end width 152. It other words, the first group of gate structures 504b, 504c with the regular gate end width 150 are formed in an inner region of the semiconductor device structure 505 while the second group gate structures 504c, 504d with the reduced gate end width 152 are formed at an outer region circumscribing the inner region of the semiconductor device structure 505. It is noted that the gate structures with different dimensions of the gate end widths may vary in number and arrangement as needed for device electrical performance arrangement and adjustment.

Figure 6:
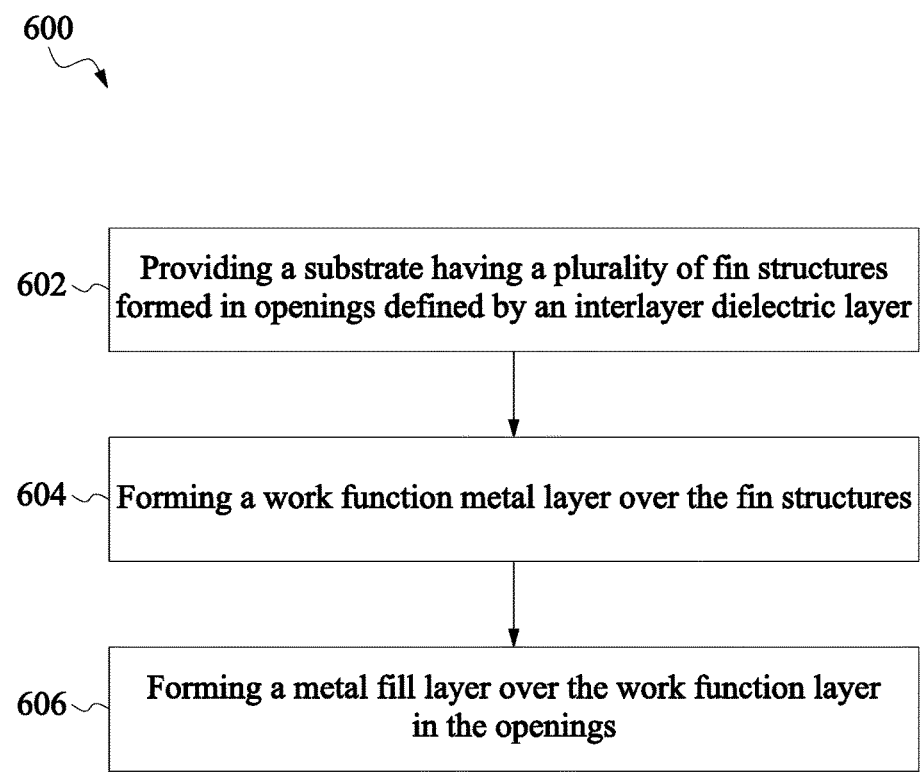
FIG. 6 is a flow chart of an exemplary process for manufacturing a device structure on a substrate in accordance with some embodiments.

FIG. 6 depicts an exemplary flow diagram of a process 600 performed to form a semiconductor device structure, such as the device structure 305 depicted in FIG. 4. FIGS. 7A-7C are schematic cross-sectional views of a portion of the substrate corresponding to various stages of the process 600 in accordance with some embodiments. The example depicted in FIGS. 7A-7C utilizing the process 600 is configured to form the semiconductor device structure 305 as previously discussed with reference to FIGS. 3-4. However, it is noted that the process 600 as well as the exemplary structures depicted in FIGS. 7A-7C may be utilized to form any suitable structures, including the semiconductor device structure 190 depicted in FIGS. 1-2B or other semiconductor structures not presented herein.

The process 600 begins at operation 602 by providing the substrate 10 having a plurality of fin structures 102 formed on a base 700, as shown in FIG. 7A. The plurality of fin structures 102 may be formed by etching a portion of the substrate 10 away to form trenches in the substrate 10 above the base 700. The trenches may then be filled with isolating material, followed by a chemical mechanical polish (CMP). Other fabrication techniques for the isolation structures and/or the fin structure 102 are possible. The isolation structures isolate some regions of the substrate 10. In one example, the isolation structures may be shallow trench isolation (STI) structures 702 and/or other suitable isolation structures. The STI structures 702 may be formed of silicon oxide, silicon nitride, silicon oxynitride, fluoride-doped silicate glass (FSG), a low-k dielectric material, and/or other suitable insulating material. The STI structures 702 may include a multi-layer structure, for example, having one or more liner layers.

In the example depicted in FIG. 7A, a gate dielectric layer 704 remains on the substrate 10. It is noted that the opening 705 defined in the ILD layer 104 may be formed by removing a dummy gate structure. The dummy gate may include a gate dielectric and a gate electrode layer. When the dummy gate structure is removed to form the opening 705 in the ILD layer 104, the gate dielectric layer 704 may or may not remain on the substrate 10. It is noted that the dummy gate may have different dimensions that meet the design layout having the mismatched gate end widths so that when the dummy gate is removed, leaving different dimensions of the openings formed in the ILD layer 104 to allow the gate structures formed therein with mismatched gate end widths. Thus, different dimensions of the openings in the LILD layer may then be utilized to form the gate structures with mismatched gate end widths as described for different device performance requirements.

Although the example depicted in FIGS. 7A-7C shows the gate dielectric layer 704 remained on the substrate 10, it is noted that in some examples, the gate dielectric layer 704 may be a sacrificial layer to be removed from the substrate 10 when the dummy gate structure is removed from the substrate 10. In such example, a gate structure may be formed directly in contact with the fin structures 102 as needed.

In one example, the gate dielectric layer 704 may be a high-k dielectric material. The high-k dielectric layer may include hafnium oxide ($HfO_2$), $TiO_2$, HfZrO, $Ta_2O_3$, $HfSiO_4$, $ZrO_2$, $ZrSiO_2$, combinations thereof, or other suitable material. The high-k dielectric layer may be formed by atomic layer deposition (ALD) and/or other suitable methods.

At operation 604, a deposition process is then performed to form the work function metal layer 106 on the gate dielectric layer 704, or directly on the fin structures 702 when the gate dielectric layer 704 is not present. As discussed above, the work function metal layer 106 is formed for tuning the work function of the gate structure. The work function metal layer 106 may be p-type work function metal materials for PMOS devices or n-type work function metal materials for NMOS devices. Suitable examples of the p-type work function metal materials include TiN, TaN, Ru, Mo, Al, WN, $ZrSi_2$, $MoSi_2$, $TaSi_2$, $NiSi_2$, WN, other suitable p-type work function metal materials, or combinations thereof while suitable examples of the n-type work function metal materials includes Ti, Ag, TaAl, TaAlC, HfAl, TiAl, TiAlN, TaC, TaCN, TaSiN, Mn, Zr, other suitable n-type work function metal materials, or combinations thereof. The work function metal layer 106 may be deposited by CVD, PVD, ALD and/or other suitable process. In one example depicted herein, the work function metal layer 106 is formed by an ALD process and the thickness of the work function metal layer 106 may be altered and adjusted by altering process parameters during the ALD deposition process, such as the deposition time, number of the pulses of precursors, pulse frequency, substrate temperature, pressure, and the like. In one example, the thickness of the work function metal layer 106 is adjusted by altering the deposition time of the ALD process for depositing the work function metal layer 106.

In one example, the work function metal layer 106 is deposited to a merged structure of the work function metal layer 106 at the end of the gate structure defined by the reduced gate end width 152 with the negligible gap width 308, such as less than 3 nm, as shown in FIG. 7B.

At operation 606, after the conformal work function metal layer 106 is formed, a metal fill deposition process is then performed to form the metal fill layer 108 filling the opening defined in the ILD layer 104 to complete the gate structure, as shown in FIG. 7C. The metal fill layer 108 may also be called as contact metal layer formed by CVD, PVD, plating, and/or other suitable processes. The metal fill layer 108 may include Al, W, or Cu and/or other suitable materials.

It is noted that the semiconductor device structure 305 is selected to have the reduced gate end width 152 at a certain range (e.g., 20% and 60% shorter than the regular gate end width 150) to provide a relative short effective gate width, as discussed above, to improve the electrical performance of the semiconductor structure 305. Additionally, the selected dimension of the reduced gate end width 152 may also provide a relatively limited space between the fin structure 102 and the ILD layer 104 so as to form the merged structure of the work function metal layer 106 with the negligible gap width 308, such as less than 3 nm at the gate end of the gate structure between the work function metal layer 106 formed on the fin structure 102 and leaning on the inner wall 164 of the ILD layer 104.

It is understood that different embodiments disclosed herein offer different disclosure, and that they may make various changes, substitutions and alterations herein without departing from the spirit and scope of the present disclosure. For example, certain embodiments disclosed herein may illustrate forming a gate structure of a FinFET device; however, other embodiments are possible including dimension reduction on planar type devices and methods of fabricating planar-type transistors using replacement gate methodologies. For example, the gate may be formed on a planar region of the substrate that provides the channel region for the device.

Thus, device structures with reduced gate end width formed at gate structures and methods for manufacturing the same are provided. The decreased dimension of the gate end width of the gate structures may have a shorter effective gate width, thus enhancing the electrical performance of the semiconductor device structures, such as higher speed, low current leakage, and tunable parameters of the device structures. Furthermore, the merged work function metal layer with greater thickness in the gate structures formed at the gate end also provides higher current, high speed and low leakage current at the similar threshold voltage ($V_t$). Also, by tuning the dimension of the gate end width 152 as well as the thickness of the work function metal layer 106, the device performance and other parameters of the FinFET may be tuned or altered.

In one example, a semiconductor device structure includes a plurality of gate structures formed over a plurality of fin structures, the gate structures formed substantially orthogonal to the fin structures, wherein the plurality of gate structures includes a first gate structure having a first gate end width and a second gate structure having a second gate end width, wherein the second gate end width is shorter than the first gate end width In another embodiment, a semiconductor device structure includes a plurality of fin structures formed on a substrate, and a plurality of gate structures formed over and substantially orthogonal to the fin structures, wherein at least two gate structures have mismatched gate end widths, wherein the gate end widths are defined between an end of one of the gate structures and a sidewall of one of the plurality of fin structures disposed closet to the end of one of the gate structures.

In yet another embodiment, a method for forming a semiconductor device structure includes forming an ILD layer having an opening defined therein on a substrate, wherein the opening is defined by a vertical inner wall in the ILD layer, forming a work function metal layer in the opening, and adjusting a thickness of the work function metal layer to form a merged structure of the work function metal layer against the vertical inner sidewall of the opening of the ILD layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor device structure, comprising:
a plurality of gate structures formed over a plurality of fin structures, the gate structures formed substantially orthogonal to the fin structures, wherein the plurality of gate structures includes:
a first gate structure having a first gate end width; and
a second gate structure having a second gate end width, wherein the second gate end width is shorter than the first gate end width, wherein a merged work function metal layer is formed in a region defined by the second gate end width, wherein the merged work function metal layer comprises a side surface of a work function metal formed over the fin structures, the side surface in contact with an inner wall of the work function metal leaning against vertical wall of an ILD layer.

2. The semiconductor device structure of claim 1, wherein the second gate end width is between about 20% and 60% shorter than the first gate end width.

3. The semiconductor device structure of claim 1, wherein the first and the second gate end widths are defined between an end of the first and second gate structures, respectively, and a sidewall of the fin structure disposed closest to the end of the first and second gate structures.

4. The semiconductor device structure of claim 1, wherein the second gate end width is less than or equal to two times thickness of the work function metal layer.

5. The semiconductor device structure of claim 1, wherein the first gate end width is greater than two times thickness of the work function metal layer.

6. The semiconductor device structure of claim 1, wherein the second gate end width is defined between a vertical wall of an ILD layer and a sidewall of an outermost of the plurality of the fin structures.

7. The semiconductor device structure of claim 1, wherein the first gate structure comprises a metal fill layer disposed on a work function metal layer.

8. The semiconductor device structure of claim 1, wherein the first gate structure is disposed on one side of a plurality of second gate structures.

9. The semiconductor device structure of claim 1, wherein the second gate structure is one gate structure of a plurality of second gate structures, wherein the plurality of the second gate structures circumscribes the first gate structure.

10. The semiconductor device structure of claim 1, wherein the first gate structure is disposed between a plurality of second gate structures.

11. The semiconductor device structure of claim 1, wherein the second gate end width is between about 20 nm and about 50 nm and the first gate end width is between about 25 nm and about 75 nm.

12. A semiconductor device structure, comprising:
a plurality of fin structures formed on a substrate; and
a plurality of gate structures formed over and substantially orthogonal to the fin structures, wherein at least two gate structures have mismatched gate end widths, wherein the gate end widths are defined between an end of one of the gate structures and a sidewall of one of the plurality of fin structures disposed closest to the end of one of the gate structures, wherein the mismatched gate end widths have between about 20% and 60% difference in width.

13. The semiconductor device structure of claim 11, wherein a merged work function metal layer is formed in a region defined by at least one of the gate end widths.

14. A method for forming a semiconductor device structure comprising:
forming an ILD layer having an opening defined therein on a substrate, wherein the opening is defined by a vertical inner sidewall in the ILD layer;
forming a work function metal layer in the opening; and adjusting a thickness of the work function metal layer to form a merged structure of the work function metal layer against the vertical inner sidewall of the opening of the ILD layer, wherein the merged structure of the work function metal layer has a width less than or equal to two times thickness of the work function metal layer.

15. The method of claim 14, wherein the merged structure is formed between the vertical inner sidewall of the opening of the ILD layer and a fin structure extending from the substrate.

16. The semiconductor device structure of claim 12, wherein the gate end widths are defined from a same fin structure of the plurality of fin structures.

17. The method of claim 14, wherein a thickness of the work function metal layer is greater than half a thickness of the merged structure.

18. The semiconductor device structure of claim 1, wherein the first gate structure comprises an unmerged work function metal layer.

19. The semiconductor device structure of claim 18, wherein the a bottommost surface of the unmerged work function metal layer is higher than an upper surface of the plurality of fin structures in a region defined by the first gate end width.

* * * * *